(12) United States Patent
Wu et al.

(10) Patent No.: US 9,213,599 B2
(45) Date of Patent: Dec. 15, 2015

(54) METHOD OF ERASE STATE HANDLING IN FLASH CHANNEL TRACKING

(71) Applicant: Seagate Technology LLC, Cupertino, CA (US)

(72) Inventors: Yunxiang Wu, Cupertino, CA (US); Zhengang Chen, San Jose, CA (US); Yu Cai, San Jose, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 212 days.

(21) Appl. No.: 14/041,110

(22) Filed: Sep. 30, 2013

(65) Prior Publication Data

US 2015/0082121 A1  Mar. 19, 2015

Related U.S. Application Data

(60) Provisional application No. 61/879,318, filed on Sep. 18, 2013.

(51) Int. Cl.

| | |
|---|---|
| *G06F 11/00* | (2006.01) |
| *H03M 13/00* | (2006.01) |
| *G11C 11/34* | (2006.01) |
| *G06F 11/10* | (2006.01) |
| *G06F 13/16* | (2006.01) |
| *G11C 16/00* | (2006.01) |
| *G06F 3/06* | (2006.01) |
| *G11C 11/56* | (2006.01) |
| *G11C 16/14* | (2006.01) |
| *G11C 16/34* | (2006.01) |

(52) U.S. Cl.
CPC .............. *G06F 11/1068* (2013.01); *G06F 3/06* (2013.01); *G06F 13/16* (2013.01); *G11C 11/5635* (2013.01); *G11C 16/00* (2013.01); *G11C 16/14* (2013.01); *G11C 16/349* (2013.01)

(58) Field of Classification Search
CPC . G06F 11/1044; G06F 11/10; G06F 11/1068; G06F 12/0246; G06F 2212/7205
USPC ......... 714/807, 755, 758, 774, 764, 793, 752; 365/185.02, 185.03, 185.09, 185.29, 365/218
See application file for complete search history.

(56) References Cited

U.S. PATENT DOCUMENTS

| | | | |
|---|---|---|---|
| 6,345,000 B1 * | 2/2002 | Wong et al. | 365/185.29 |
| 7,421,557 B2 | 9/2008 | Lee et al. | 711/167 |
| 7,593,259 B2 * | 9/2009 | Kim | 365/185.03 |
| 7,876,621 B2 | 1/2011 | Sharon et al. | 365/185.24 |
| 7,903,468 B2 | 3/2011 | Litsyn et al. | 365/185.24 |

(Continued)

OTHER PUBLICATIONS

Cai, Yu, et al., "Threshold Voltage Distribution in MLC NAND Flash Memory: Characterization, Analysis, and Modeling", 2013, pp. 1-6.

(Continued)

*Primary Examiner* — Christine Tu
(74) *Attorney, Agent, or Firm* — Christopher P. Maiorana, PC

(57) ABSTRACT

An apparatus includes a non-volatile memory and a controller. The controller may be configured to track one or more channel parameters of the non-volatile memory. The controller may be further configured to estimate an erase state voltage distribution of the non-volatile memory by selecting one or more parameters of the erase state distribution from a look-up table based upon at least one of the one or more channel parameters.

20 Claims, 5 Drawing Sheets

(56) References Cited

U.S. PATENT DOCUMENTS

| | | | |
|---|---|---|---|
| 7,908,425 B2 | 3/2011 | Lee et al. | 711/103 |
| 8,125,833 B2 | 2/2012 | Sharon et al. | 365/185.24 |
| 8,289,781 B2 | 10/2012 | Litsyn et al. | 365/185.24 |
| 8,374,026 B2 | 2/2013 | Sharon et al. | 365/185.02 |
| 8,839,073 B2 * | 9/2014 | Cohen | 714/763 |
| 2008/0263265 A1 | 10/2008 | Litsyn et al. | 711/103 |
| 2008/0263266 A1 | 10/2008 | Sharon et al. | 711/103 |
| 2011/0066902 A1 | 3/2011 | Sharon et al. | 714/721 |
| 2011/0134692 A1 | 6/2011 | Sharon et al. | 365/185.2 |
| 2011/0182118 A1 | 7/2011 | Litsyn et al. | 365/185.2 |
| 2013/0024605 A1 | 1/2013 | Sharon et al. | 711/103 |
| 2013/0024743 A1 | 1/2013 | Sharon et al. | 714/763 |
| 2013/0024746 A1 | 1/2013 | Sharon et al. | 714/766 |
| 2013/0024747 A1 | 1/2013 | Sharon et al. | 714/773 |
| 2013/0024748 A1 | 1/2013 | Sharon et al. | 714/773 |
| 2013/0135927 A1 | 5/2013 | Jeon | 365/185.03 |

OTHER PUBLICATIONS

Cai, Yu, et al., "Error Patterns in MLC NAND Flash Memory: Measurement, Characterization, and Analysis", 2012, pp. 1-6.

* cited by examiner

TABLE 2

| PEC \ RD | 1 | | 5K | | 10K | | 15K | | >20K | |
|---|---|---|---|---|---|---|---|---|---|---|
| 1 | M_1_1 | V_1_1 | M_1_5K | V_1_5K | M_1_10K | V_1_10K | M_1_15K | V_1_15K | M_1_20K | V_1_20K |
| 1K | M_1K_1 | V_1K_1 | M_1K_5K | V_1K_5K | M_1K_10K | V_1K_10K | M_1K_15K | V_1K_15K | M_1K_20K | V_1K_20K |
| 2K | M_2K_1 | V_2K_1 | M_2K_5K | V_2K_5K | M_2K_10K | V_2K_10K | M_2K_15K | V_2K_15K | M_2K_20K | V_2K_20K |
| 3K | M_3K_1 | V_3K_1 | M_3K_5K | V_3K_5K | M_3K_10K | V_3K_10K | M_3K_15K | V_3K_15K | M_3K_20K | V_3K_20K |
| 4K | M_4K_1 | V_4K_1 | M_4K_5K | V_4K_5K | M_4K_10K | V_4K_10K | M_4K_15K | V_4K_15K | M_4K_20K | V_4K_20K |
| 5K | M_5K_1 | V_5K_1 | M_5K_5K | V_5K_5K | M_5K_10K | V_5K_10K | M_5K_15K | V_5K_15K | M_5K_20K | V_5K_20K |
| 6K | M_6K_1 | V_6K_1 | M_6K_5K | V_6K_5K | M_6K_10K | V_6K_10K | M_6K_15K | V_6K_15K | M_6K_20K | V_6K_20K |
| 7K | M_7K_1 | V_7K_1 | M_7K_5K | V_7K_5K | M_7K_10K | V_7K_10K | M_7K_15K | V_7K_15K | M_7K_20K | V_7K_20K |
| 8K | M_8K_1 | V_8K_1 | M_8K_5K | V_8K_5K | M_8K_10K | V_8K_10K | M_8K_15K | V_8K_15K | M_8K_20K | V_8K_20K |
| 9K | M_9K_1 | V_9K_1 | M_9K_5K | V_9K_5K | M_9K_10K | V_9K_10K | M_9K_15K | V_9K_15K | M_9K_20K | V_9K_20K |
| 10K | M_10K_1 | V_10K_1 | M_10K_5K | V_10K_5K | M_10K_10K | V_10K_10K | M_10K_15K | V_10K_15K | M_10K_20K | V_10K_20K |
| 11K | M_11K_1 | V_11K_1 | M_11K_5K | V_11K_5K | M_11K_10K | V_11K_10K | M_11K_15K | V_11K_15K | M_11K_20K | V_11K_20K |
| 12K | M_12K_1 | V_12K_1 | M_12K_5K | V_12K_5K | M_12K_10K | V_12K_10K | M_12K_15K | V_12K_15K | M_12K_20K | V_12K_20K |

M = MEAN
V = VARIANCE

FIG. 3

METHOD OF ERASE STATE HANDLING IN FLASH CHANNEL TRACKING

This application relates to U.S. Provisional Application No. 61/879,318, filed Sep. 18, 2013, which is hereby incorporated by reference in its entirety.

FIELD OF THE INVENTION

The invention relates to non-volatile memory management generally and, more particularly, to a method and/or apparatus for implementing a method of erase state handling in flash channel tracking.

BACKGROUND

With aggressive process scaling, a raw bit error rate (RBER) of NAND flash memory is increasing. To maintain a particular level of reliability, solid-state drive/disk (SSD) controllers are adopting soft decoded error correction codes, such as low density parity check (LDPC) codes. Soft decoded error correction codes are more powerful in correcting errors, but need soft information as an input to the decoder. The soft information is typically in the form of a log likelihood ratio (LLR). Conventional flash devices do not provide soft decisions. The SSD controllers have to calculate the soft decisions using either hardware or software. In order to calculate LLRs, information about cell voltage distributions is needed. For different types of NAND flash memory, the number of programmed cell voltage distributions is different. A characteristic of NAND flash channels is that the cell voltage distributions can change with a number of factors. Factors that affect the cell voltage distributions include number of program and erase cycles (PEC), retention time, temperature, and read disturb. In order to keep the information about the cell voltage distributions up-to-date, the SSD controllers repeatedly estimate the cell voltage distributions. The repeated estimation of the cell voltage distributions is called channel tracking. The mean of the voltage distribution for an erase state of NAND flash memory can be well below zero volts for small PEC numbers. Because existing NAND flash memory does not allow reading to negative voltages in normal operation mode, tracking the erase state of the NAND flash memory is problematic. Without erase state tracking, setting read reference voltage (Vref) and calculating LLRs becomes unreliable. It would be desirable to have a method of erase state handling in flash channel tracking that solves this problem.

SUMMARY

The invention concerns an apparatus comprising an apparatus including a non-volatile memory and a controller. The controller may be configured to track one or more channel parameters of the non-volatile memory. The controller may be further configured to estimate an erase state voltage distribution of the non-volatile memory by selecting one or more parameters of the erase state distribution from a look-up table based upon at least one of the one or more channel parameters.

BRIEF DESCRIPTION OF THE FIGURES

Embodiments of the invention will be apparent from the following detailed description and the appended claims and drawings in which:

FIG. 3 illustrates an example look-up table based on multiple parameters;

DETAILED DESCRIPTION OF THE EMBODIMENTS

Embodiments of the invention include providing a method of erase state handling in flash channel tracking that may (i) provide erase state tracking without firmware, (ii) characterize distribution parameters of the erase state offline, (iii) characterize distribution parameters of the erase state based on one or more channel parameters or statistics (e.g., program/erase cycle count, retention time, read disturb count, etc.), (iv) provide a look-up table containing channel parameter(s) and distribution parameters, and/or (v) be used in connection with soft decoded error correction codes.

Figure 1:
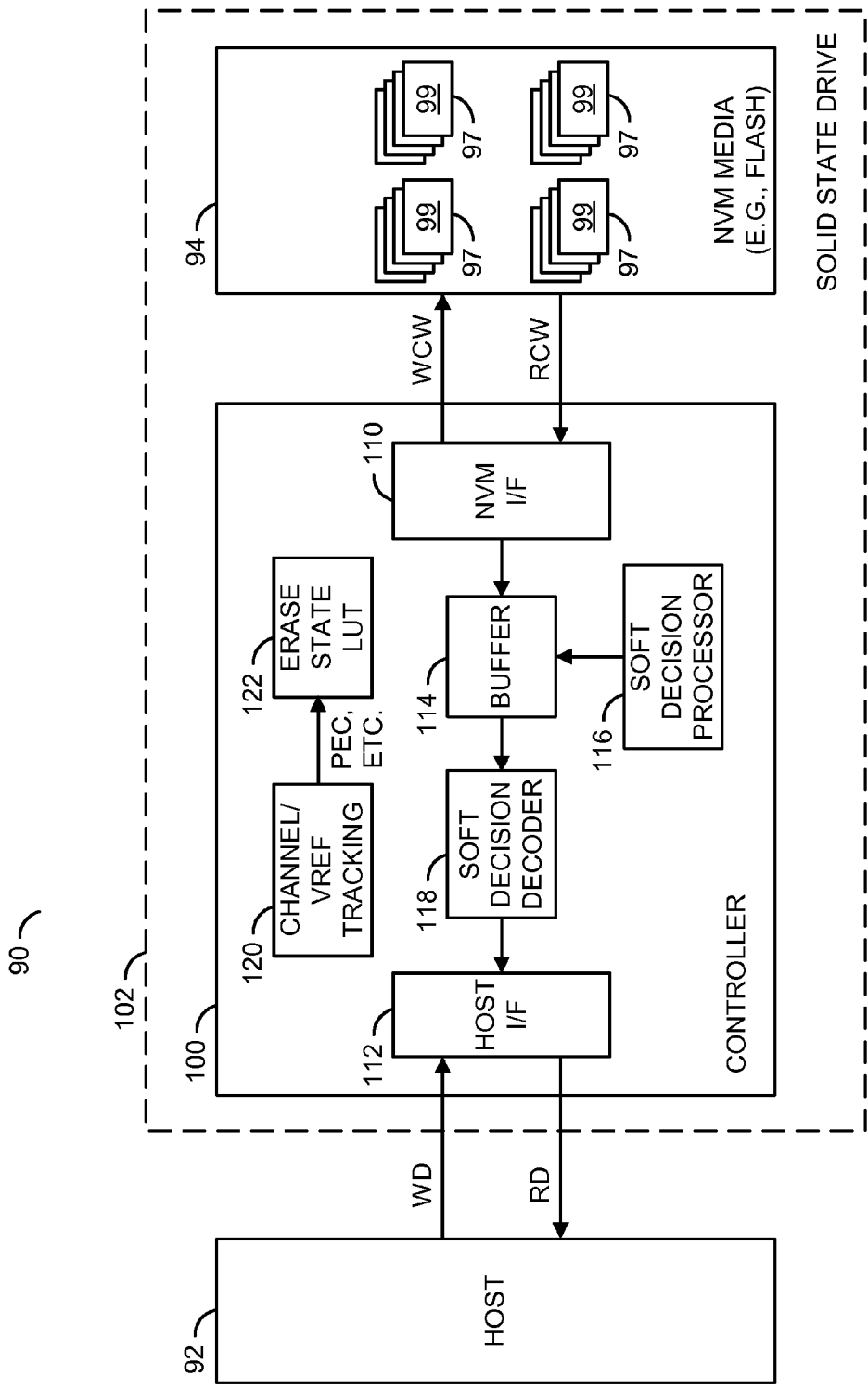
FIG. 1 is a diagram of an example implementation of an apparatus in accordance with an embodiment of the invention.

Referring to FIG. 1, a block diagram of an example implementation of an apparatus 90 is shown. The apparatus (or circuit or device or integrated circuit) 90 implements a computer system having a non-volatile memory circuit. The apparatus 90 generally comprises a block (or circuit) 92, a block (or circuit) 94 and a block (or circuit) 100. The circuits 92, 94 and 100 may represent modules and/or blocks that may be implemented as hardware (circuitry), software, a combination of hardware and software, or other implementations. A combination of the circuits 94 and 100 may form a solid state drive/disk (SSD) 102.

A signal (e.g., WD) is generated by the circuit 92 and presented to the circuit 100. The signal WD generally conveys write data to be written into the circuit 94. A signal (e.g., WCW) is generated by the circuit 100 and transferred to the circuit 94. The signal WCW carries error correction coded (e.g., ECC) write codewords written into the circuit 94. A signal (e.g., RCW) is generated by the circuit 94 and received by the circuit 100. The signal RCW carries error correction coded codewords read from the circuit 94. A signal (e.g., RD) is generated by the circuit 100 and presented to the circuit 92. The signal RD carries error corrected versions of the data in the signal RCW. The contents of the signals WD and RD are generally associated with write and read commands (or requests), respectively, from the circuit 92. The circuit 92 is shown implemented as a host circuit. The circuit 92 is generally operational to read and write data to and from the circuit 102. When writing, the circuit 92 presents the write data in the signal WD. The read data requested by the circuit 92 is received via the signal RD.

The circuit 100 is shown implemented as a controller circuit. The circuit 100 is generally operational to control reading from and writing to the circuit 94. The circuit 100 may be implemented as one or more integrated circuits (or chips or die). The circuit 100 is used for controlling one or more solid state drives, embedded storage, non-volatile memory devices, or other suitable control applications.

In various embodiments, the circuit 100 generally comprises a block (or circuit) 110, a block (or circuit) 112, a block (or circuit) 114, a block (or circuit) 116, a block (or circuit) 118, a block (or circuit) 120 and a block (or circuit) 122. The circuit 110 implement a non-volatile memory (e.g., flash) interface. The circuit 112 implements a host interface. The circuit 114 may be implemented as a memory buffer. The circuit 116 may be implement as a soft decision processor. The circuit 118 may implement a soft decoder. The circuit 120 may implement a channel/Vref tracking module. The circuit 122 may implement a look-up table (LUT) containing parameters estimating an erase state distribution associated with various values of channel parameters. The circuits 110 to 122 may represent modules and/or blocks that may be implemented as hardware, software, a combination of hardware and software, or other implementations.

The circuit 100 may be configured to control one or more individual non-volatile memory lanes. In some embodiments, the circuit 100 may implement multiple memory lane controller instances to control a plurality of non-volatile memory lanes. The non-volatile memory interface 110 is configured to couple the circuit 100 to the non-volatile memory media 94. The non-volatile memory media 94 may comprises one or more non-volatile memory devices 97. The non-volatile memory devices 97 have, in some embodiments, one or more non-volatile memory die 99. According to a type of a particular one of the non-volatile memory devices 97, a plurality of non-volatile memory die 99 in the particular non-volatile memory device 97 are optionally and/or selectively accessible in parallel. The non-volatile memory devices 97 are generally representative of one type of storage device enabled to communicatively couple to the circuit 100. However, in various embodiments, any type of storage device is usable, such as SLC (single level cell) NAND flash memory, MLC (multi-level cell) NAND flash memory, TLC (triple level cell) NAND flash memory, NOR flash memory, electrically programmable read-only memory (EPROM or EEPROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), resistive random-access memory (RRAM or ReRAM), or any other type of memory device or storage medium.

In some embodiments, the circuit 100 and the non-volatile memory media 94 are implemented on separate integrated circuits. When the circuit 100 and the non-volatile memory media 94 are implemented as separate integrated circuits (or devices), the non-volatile memory interface 110 is generally enabled to manage a plurality of data input/output (I/O) pins and a plurality of control I/O pins. The data I/O pins and the control I/O pins may be configured to connect the device containing the controller 100 to the external device(s) forming the non-volatile memory media 94. In various embodiments, the circuit 100 is implemented as an embedded controller. In various embodiments, the circuit 100 and the NVM media 94 implement the solid-state drive (SSD) 102.

The command interface 112 is configured to receive commands and send responses to the host 92. In embodiments implementing a plurality of non-volatile memory lanes, the circuit 100 may also include multiplexing circuitry coupling the multiple instances of memory lane controllers to a processing unit providing scheduling and/or data management of the plurality of non-volatile memory devices 97. In some embodiments, the processing unit comprises data buffering and direct memory access (DMA) engines to store data or other information and to move the data or other information between the host 92 and the NVM media 94 using one or more memory lane controllers within the circuit 100.

When a non-volatile memory read operation is performed (e.g., in response to a request originating either externally from the host 92 or internally from the circuit 100) raw data is retrieved from the NVM media 94 and placed in the buffer 114. In various embodiments, to ensure the data returned is correct, the soft decision processor 116 and the soft decoder 118 in the circuit 100 correct the raw data read from the NVM media 94. In some embodiments, LDPC (low-density parity-check) code is used. The soft decoder 118 generally operates on a granularity of a codeword (of fixed or variable size), referred to as an e-page.

The circuit 110 is shown implemented as a non-volatile memory (e.g., Flash) interface circuit. In various embodiment, the circuit 110 is operational to provide communication with the circuit 94 via the signals WCW and RCW. Other signals may be implemented between the circuits 94 and 110 to meet the criteria of a particular application.

The circuit 112 is shown implemented as a host interface circuit. The circuit 112 is operational to provide communication with the circuit 92 via the signals WD and RD. Other signals may be implemented between the circuits 92 and 112 to meet the criteria of a particular application.

The circuit 114 is shown implemented as a buffer (memory) circuit. The circuit 114 is operational to buffer (store) codewords received from the circuit 94 via the circuit 110. The circuit 114 is also operational to buffer decoding parameters generated by the circuit 116. The read codewords and the decoding parameters are presented from the circuit 114 to the circuit 118.

The circuit 116 is shown implemented as a soft-decision processor circuit. The circuit 116 is operational to generate decoding parameters (e.g., log likelihood ratio (LLR) values). The LLR values are used in a soft-decision decoding process performed by the circuit 118. The decoding parameters are presented by the circuit 116 to the circuit 114 for storage, or in other embodiments (not illustrated) to circuit 118 directly. The circuit 116 may be implemented as a dedicated hardware unit that processes raw soft bits read from the circuit 94. The circuit 116 generally uses information regarding an erase state distribution of the circuit 94 in the process of generating the decoding parameters. The circuit 116 may be implemented as a processor core (e.g., an ARM core) or a custom designed circuit.

The circuit 118 is shown implemented as a soft-decision decoder circuit. In some embodiments, the circuit 118 is implemented as one or more low-density parity-check decoder circuits. The circuit 118 is operational to perform both hard-decision (e.g., HD) decoding and soft-decision (e.g., SD) decoding of the codewords received from the circuit 114. The soft-decision decoding generally utilizes the decoding parameters created by the circuit 116 and/or the circuits 120 and 122.

The circuit 120 is shown implemented as a channel and reference voltage (VREF) tracking circuit. The circuit 120 is operational to track channel parameters and/or statistics. The channel parameters and/or statistics may include, but is not limited to a count of the number of program and erase (P/E) cycles (PEC), charge loss over time (retention times), program interference from the programming of neighboring cells (write disturb counts), program interference from the reading of neighboring cells (read disturb counts), and non-erase state read voltage distributions. The circuit 120 is also operational provide inputs to the circuit 122 based on one or more of the tracked channel parameters and/or statistics.

The circuit 122 is shown implemented as a erase state look-up table (LUT) circuit. The circuit 122 is operational to store information regarding erase state parameters (e.g., mean, variance, standard deviation, etc.) corresponding to a plurality of channel parameter values. The circuit 122 is also operational to select particular erase state parameters based on current channel parameter values and provide the selected erase state parameters to the circuit 116 for use in the soft decision process. For example, the distribution of the erase state can be used in read reference voltage (Vref) estimation and LLR calculation. In some embodiments, the look-up table 122 may be stored as part of the data buffer held in the circuit 114.

Figure 2:
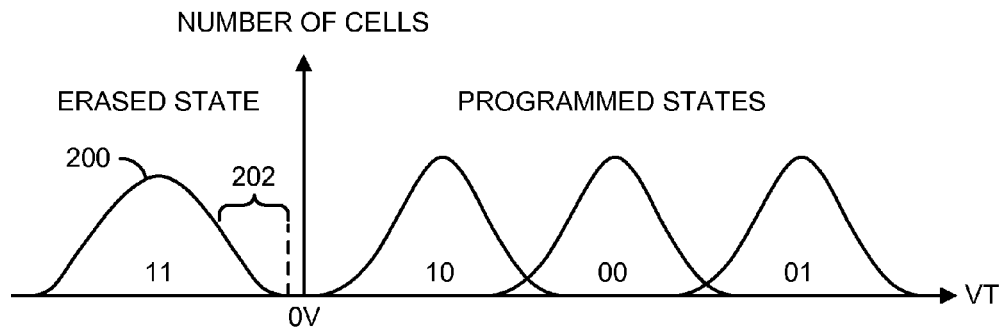
FIG. 2 is a diagram illustrating an example of cell voltage distributions of a multi-level cell (MLC) flash memory.

Referring to FIG. 2, a diagram is shown illustrating example cell voltage distributions of a MLC NAND flash memory. A distribution 200 for an erase state (ER) of the NAND flash memory appears on the left of the graph. The mean of the voltage distribution for the erase state ER can be well below zero volts for small PEC numbers. In general, only a small portion of the right tail 202 of the distribution 200 can be accessed (read). At very high PEC, larger portions of the distribution 200 may be accessed because the distribution of the erase state shifts toward higher voltage (see FIG. 4).

In various embodiments, the information stored in the look-up table 122 comprises pre-characterized erase state distribution parameters associated with particular channel parameter values. The pre-characterized erase state distribution parameters are used when tracking of erase state is not reliable. The distribution of the erase state is difficult to estimated because the main part of the distribution is normally not accessible. The erase state distribution is estimated using a flash characterization process where known data is written to the flash memory and then read from the flash memory. The erase state distribution can be reasonably estimated even when only a small portion of the tail 202 of the erase state distribution curve is accessible.

The erase state distribution is a function of many statistical parameters (e.g., P/E cycling count, retention, read disturb count, etc.). The look-up table 122 is generally made up of the erase state distribution parameters (e.g., mean and variance, mean and standard deviation, etc.) corresponding to particular values of the statistical parameters. The more statistical parameters used in the table, the larger the size of the table. In one example, a look-up table 122 based on P/E cycle count only may be summarized as in the following TABLE 1:

TABLE 1

| P/E Count | Mean | Variance |
| --- | --- | --- |
| 1 | mean1 | var1 |
| 1000 | mean1000 | var1000 |
| 2000 | mean2000 | var2000 |
| 3000 | mean3000 | var3000 |
| 4000 | mean4000 | var4000 |
| 5000 | mean5000 | var5000 |
| 6000 | mean6000 | var6000 |
| 7000 | mean7000 | var7000 |
| 8000 | mean8000 | var8000 |
| 9000 | mean9000 | var9000 |
| 10000 | mean10000 | var10000 |
| 11000 | mean11000 | var11000 |
| 12000 | mean12000 | var12000 |

However look-up tables based on multiple channel statistics (e.g., P/E cycle count, retention time, and/or read disturb count) can be implemented also (e.g., see TABLE 2 in FIG. 3).

In various embodiments, tracking of the erase state is performed using the look-up table 122 rather than using firmware. Distribution parameters of the erase state are characterized offline taking into account various factors that are of interest (e.g., PEC, retention, etc.). Because the distribution of erase state is close to a Gaussian distribution (as illustrated in FIG. 2), the erase state distribution is generally characterized by parameters of mean and variance (or standard deviation). However, other methods of characterizing the erase state distribution may be implemented accordingly to meet the design criteria of a particular implementation. The parameters are saved as a look-up table along with the corresponding variables of interest such as P/E cycling count, read disturb count, and/or retention time.

Figure 4:
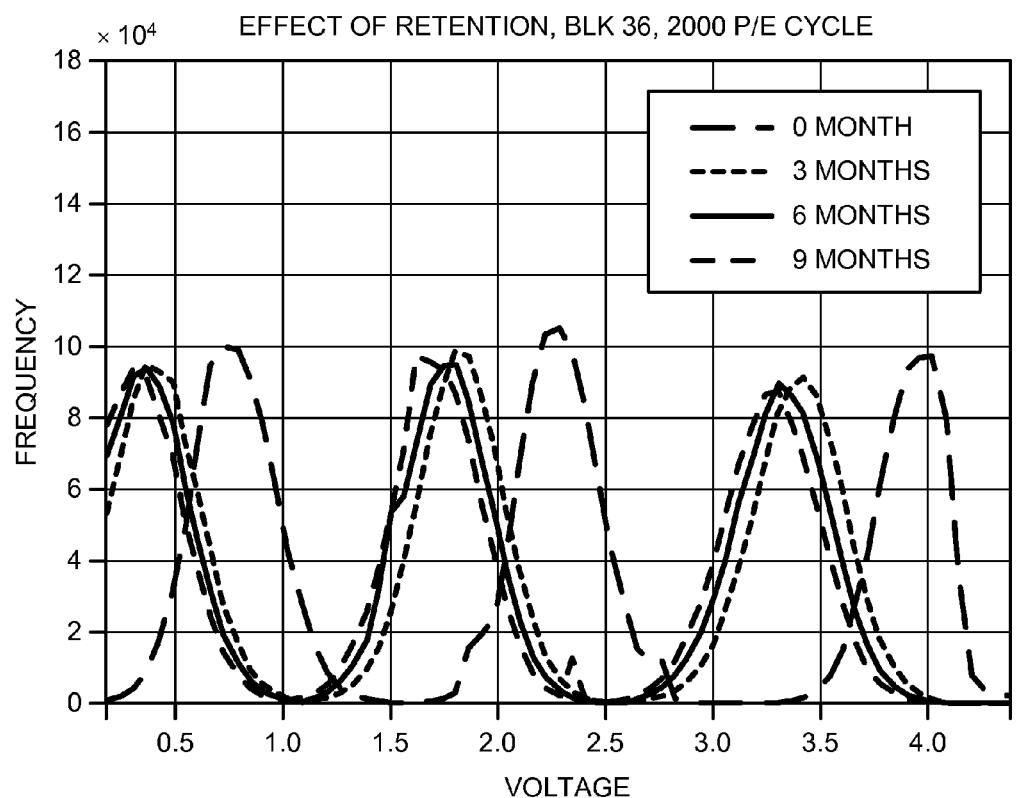
FIG. 4 is a diagram illustrating an effect of cell voltage distributions of non-erase states.

Referring to FIG. 4, a diagram is shown illustrating an effect of retention on cell voltage distributions of non-erase states of a MLC NAND flash memory. As shown in FIG. 4, the cell voltage distributions can shift over time, hence the need for SSD controllers to repeatedly estimate the cell voltage distributions through channel tracking.

Figure 5:
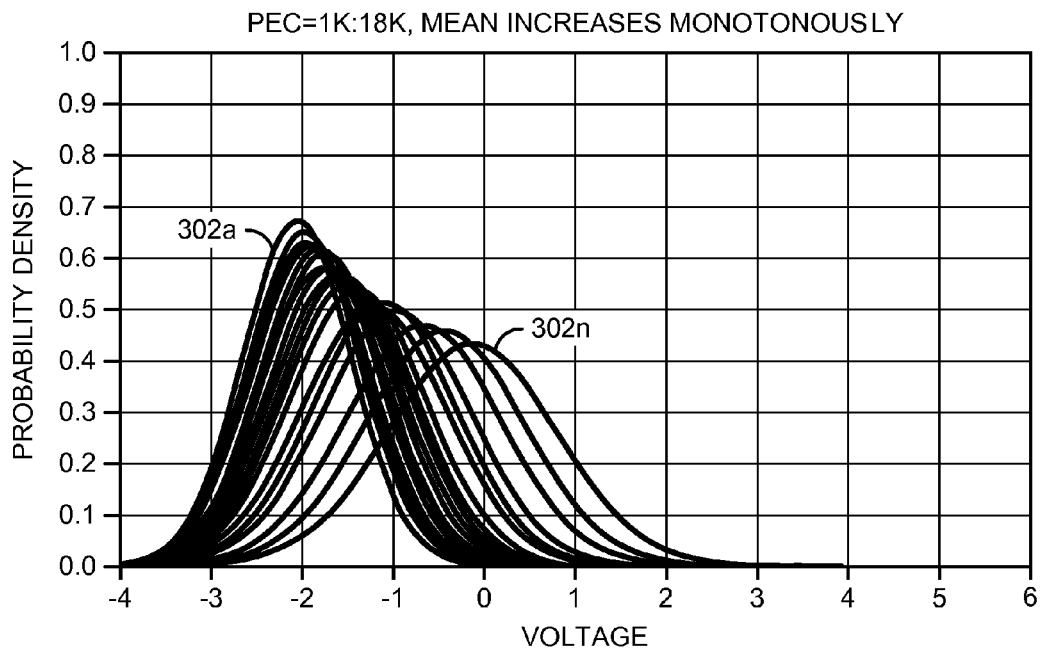
FIG. 5 is a diagram illustrating variation in erase state distribution for a number of program and erase cycle counts.

Referring to FIG. 5, a diagram is shown illustrating variation in an erase state distribution over a range of program and erase cycle (PEC) counts. The means of the erase state distributions $302a$-$302n$ monotonically increase as the value of the program and erase cycle (PEC) count increases from 1K to 18K.

Figure 6:
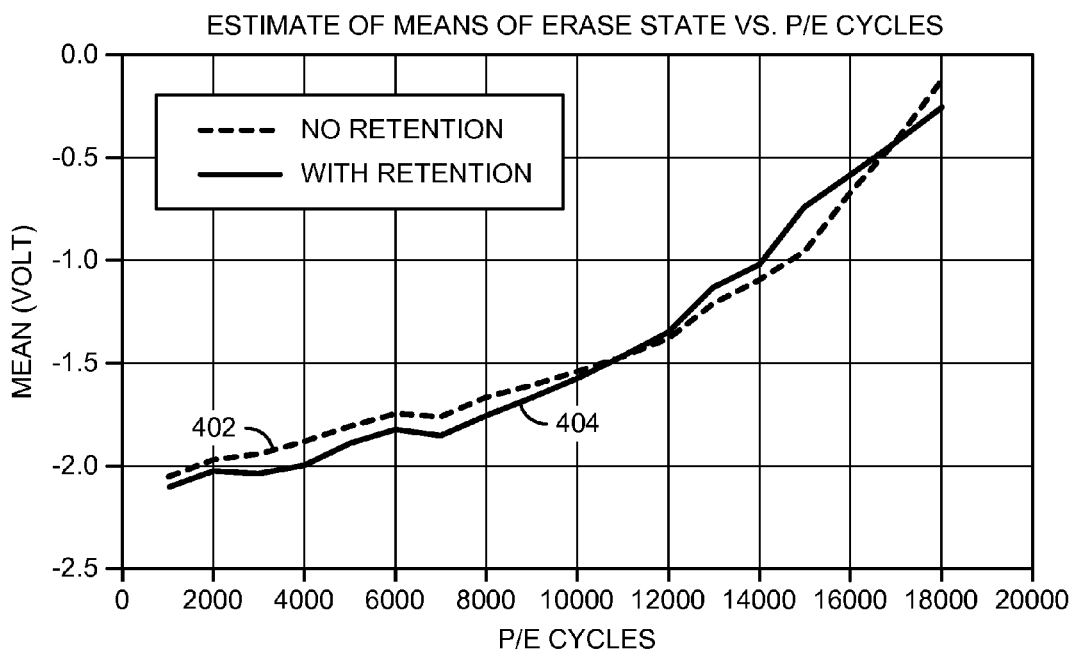
FIG. 6 is a diagram illustrating estimated means of the erase state distribution versus program and erase cycles with and without retention.

Referring to FIG. 6, a diagram is shown illustrating estimated means of the erase state distribution versus program and erase (P/E) cycle counts with and without retention. Estimated means of the erase state distribution versus P/E cycle counts without retention errors are shown as curve 402. Estimated means of the erase state distribution versus P/E cycle counts with retention errors are shown by a curve 404. Characterization of the flash cells over the range of P/E cycles without retention errors can be done by scanning the threshold voltage immediately after the cells finish programming, which ensures that charge loss in the programmed cells is kept to a minimum. Comparing the curve 402 with the curve 404, the mean of the erase state distribution varies significantly with the number of P/E cycles, but not so much with retention time.

Figure 7:
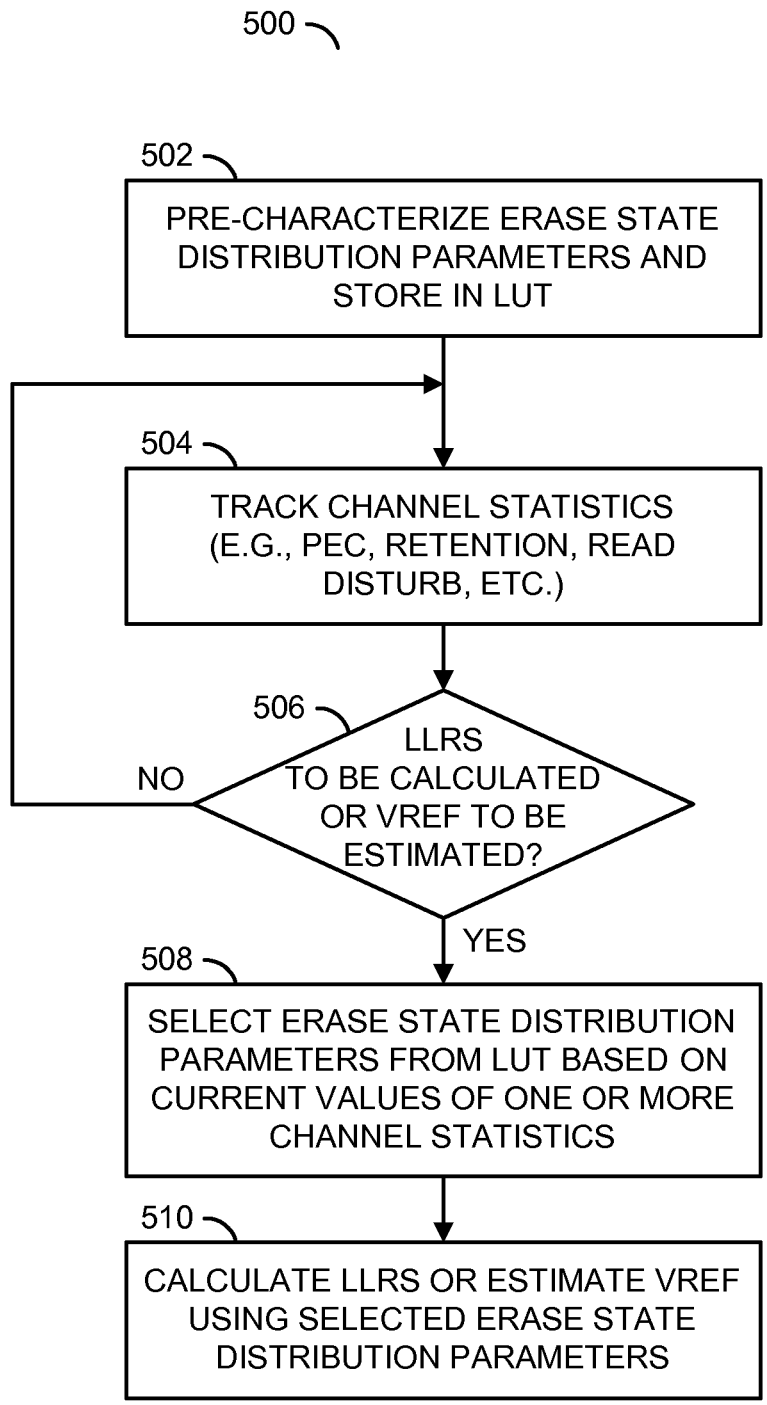
FIG. 7 is a flow diagram of an example method for erase state handling in accordance with an embodiment of the invention.

Referring to FIG. 7, a flow diagram of a process 500 is shown illustrating an example method for erase state handling in accordance with an embodiment of the invention. In a step 502, erase state distribution parameters associated with particular channel parameter values are pre-characterized (e.g., offline) and stored in a look-up table of a memory controller. In a step 504, the channel parameters are tracked during a normal operating mode of the memory controller to allow the pre-characterized erase state distribution parameters to be used when tracking of the erase state is not reliable. For example, in a step 506, the process 500 checks whether LLRs are to be calculated (e.g., raw data needs decoding). When LLRs are to be calculated, the process 500 moves to a step 508 where erase state distribution parameters (e.g., mean and variance) are selected from the look-up table according to the current values of one or more of the channel parameters or statistics (e.g., number of P/E cycles, retention, read disturb count, etc.). The process 500 then moves to a step 510 where the LLRs are calculated using the selected erase state distribution parameters from the look-up table.

The functions represented by the diagrams of FIGS. 1 and 7 may be implemented (e.g., simulated) using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a non-volatile memory; and
a controller configured to track one or more channel statistics of the non-volatile memory, wherein the controller estimates a current erase state voltage distribution of the non-volatile memory by selecting one or more parameters of a pre-characterized erase state voltage distribution from a look-up table based upon at least one of the one or more channel statistics tracked by the controller.

2. The apparatus according to claim 1, wherein the one or more channel statistics comprise a statistical parameter indicating a number of program and erase cycles, a statistical parameter indicating a retention time, a statistical parameter indicating an amount of write disturb, and a statistical parameter indicating an amount of read disturb.

3. The apparatus according to claim 1, wherein the one or more parameters of the pre-characterized erase state voltage distribution comprise pre-determined mean and variance values.

4. The apparatus according to claim 1, wherein the one or more parameters of the pre-characterized erase state voltage distribution comprise mean and standard deviation values.

5. The apparatus according to claim 1, wherein the look-up table associates a respective set of parameters of the pre-characterized erase state voltage distribution with each of a plurality of values of the one or more channel statistics.

6. The apparatus according to claim 1, wherein the controller is further configured to perform error correction on data read from the non-volatile memory using a soft decode error correction code.

7. The apparatus according to claim 6, wherein the soft decode error correction code comprises a low density parity check code.

8. The apparatus according to claim 6, wherein the controller is configured to calculate one or more soft decisions based on the one or more parameters of the pre-characterized erase state voltage distribution selected from the look-up table.

9. The apparatus according to claim 8, wherein the soft decisions comprise a log likelihood ratio (LLR).

10. The apparatus according to claim 1, wherein the non-volatile memory and the controller are part of a solid state drive (SSD).

11. A method of erase state handling in flash channel tracking comprising:
tracking one or more channel statistics of a non-volatile memory; and
estimating a current erase state voltage distribution of the non-volatile memory by selecting one or more parameters of a pre-characterized erase state voltage distribution from a look-up table based upon at least one of the one or more channel statistics.

12. The method according to claim 11, wherein the one or more channel statistics comprise a statistical parameter indicating a number of program and erase cycles, a statistical parameter indicating a retention time, a statistical parameter indicating an amount of write disturb, and a statistical parameter indicating an amount of read disturb.

13. The method according to claim 11, wherein the one or more parameters of the pre-characterized erase state voltage distribution comprise pre-determined mean and variance values.

14. The method according to claim 11, wherein the one or more parameters of the pre-characterized erase state voltage distribution comprise mean and standard deviation values.

15. The method according to claim 11, wherein the look-up table associates a respective set of parameters of the pre-characterized erase state voltage distribution with each of a plurality of values of the one or more channel statistics.

16. The method according to claim 11, further comprising:
calculating a log likelihood ratio (LLR) based upon the one or more parameters of the pre-characterized erase state voltage distribution selected from the look-up table.

17. The method according to claim 11, further comprising:
estimating a read reference voltage threshold based upon the one or more parameters of the pre-characterized erase state voltage distribution selected from the look-up table.

18. An apparatus comprising;
an interface circuit configured to process a plurality of read/write operations to/from a non-volatile memory; and
a controller circuit configured to track channel statistics of the non-volatile memory, wherein the controller circuit estimates a current erase state voltage distribution of the non-volatile memory by selecting one or more parameters of a pre-characterized erase state voltage distribution from a look-up table based upon at least one of the channel statistics tracked by the controller circuit.

19. The apparatus according to claim 18, wherein the channel statistics tracked by the controller circuit comprise at least one of a statistical parameter indicating a number of program and erase cycles, a statistical parameter indicating a retention time, a statistical parameter indicating an amount of write disturb, and a statistical parameter indicating an amount of read disturb.

20. The apparatus according to claim 18, wherein:
the look-up table associates a plurality of parameters descriptive of the pre-characterized erase state voltage distribution with particular values of at least one of the channel statistics tracked by the controller circuit; and
the plurality of parameters descriptive of the pre-characterized erase state voltage distribution comprise one or more of a pre-determined mean value, a pre-determined standard deviation value, and a pre-determined variance value for each particular value of the at least one of the channel statistics tracked by the controller circuit.

* * * * *